United States Patent
Gau

(10) Patent No.: US 6,187,649 B1
(45) Date of Patent: Feb. 13, 2001

(54) SHALLOW TRENCH ISOLATION PROCESS

(75) Inventor: Jing-Horng Gau, Hsinchu Hsien (TW)

(73) Assignees: United Semiconductor Corp.; United Microelectronics Corp.

(*) Notice: Under 35 U.S.C. 154(b), the term of this patent shall be extended for 0 days.

(21) Appl. No.: 09/348,409

(22) Filed: Jul. 7, 1999

(51) Int. Cl.$^7$ ................................................. H01L 21/7621
(52) U.S. Cl. ............................................ 438/424; 257/221
(58) Field of Search .................................. 438/424, 426, 438/430, 433, 221, 224

(56) References Cited

U.S. PATENT DOCUMENTS

| | | | |
|---|---|---|---|
| 4,599,789 | * | 7/1986 | Gasner ................................. 438/224 |
| 5,733,383 | * | 3/1998 | Fazan et al. ........................ 438/424 |
| 5,960,298 | * | 9/1999 | Kim ..................................... 438/424 |
| 6,022,781 | * | 2/2000 | Noble, Jr. et al. .................. 438/296 |

* cited by examiner

Primary Examiner—Olik Chaudhuri
Assistant Examiner—Anh Duy Mai
(74) Attorney, Agent, or Firm—Thomas, Kayden, Horstemeyer & Risley

(57) ABSTRACT

A shallow trench isolation process is described. A pad oxide layer is formed over a substrate. A silicon nitride layer is formed over the pad oxide layer. The silicon nitride layer is patterned. The pad oxide layer and the substrate are etched using the patterned silicon nitride as an etching mask, and thus a trench is formed in the substrate. A liner oxide layer is grown over the trench. An oxide layer is deposited to fill the trench in the substrate and has a surface level higher than the silicon nitride layer. The oxide layer is polished to partially remove the oxide layer over the silicon nitride layer. The silicon nitride layer is removed from the substrate, by which removal the oxide layer has an exposed sidewall. A polysilicon spacer is formed on the exposed sidewall. The pad oxide layer is removed. The polysilicon spacer is oxidized and transformed into an oxide spacer.

17 Claims, 6 Drawing Sheets

SHALLOW TRENCH ISOLATION PROCESS

BACKGROUND OF THE INVENTION

1. Field of Invention

The present invention relates to a process for fabricating an integrated circuit. More particularly, the present invention relates to a shallow trench isolation process.

2. Description of Related Art

Shallow trench isolation is a technique applicable for fabricating isolation devices in many different very large semiconductor integration (VLSI) circuits. Trenches are formed between the metal-oxide-semiconductor (MOS) devices over a substrate of an integration circuit. The trenches are then filled with insulation material for electrically isolating those devices.

FIGS. 1A–1F are schematic, cross-sectional views of a conventional shallow trench isolation (STI) process.

Referring to FIG. 1A, a pad oxide layer 102 is grown over a substrate 100. A silicon nitride layer 104 is formed over the pad oxide layer 102.

Referring to FIG. 1B, the silicon nitride layer 104, the pad oxide layer 102, and the substrate 100 are patterned, and thus a trench 106 is formed in the substrate 100. The trench 106 has a top corner 106a.

Still referring to FIG. 1B, a liner oxide layer 108 is conformally formed over the trench 106.

Referring to FIG. 1C, an oxide layer (not shown) is formed over the silicon nitride layer 104 and the substrate 100, and thus the trench 106 (shown in FIG. 1B) is filled with the oxide layer. The oxide layer over the silicon nitride layer 104 is partially removed by chemical-mechanical polishing. Being partially removed, the remaining oxide layer is represented by reference numeral 110.

Referring to FIG. 1D, the silicon nitride layer 104 (shown in FIG. 1C) and the pad oxide layer 102 (shown in FIG. 1C) are stripped by wet etching, and the oxide layer 110 thus has an exposed sidewall 110a. After this removing step, another wet etching step is performed to fabricate devices (not shown) over the substrate 100. In those wet etching steps, the etching recipes used often erode the exposed sidewall 110a of the oxide layer 110, and thus a hollow 112 in the oxide layer 110 is formed near the top corner 106a of the trench 106. A conductive layer (not shown) is then deposited over the oxide layer 110 and the substrate 100, but the conductive layer causes shorts through the hollow 112 between devices (not shown) subsequently formed over the substrate 100. Moreover, the top corner 106a of the trench 106, exposed when the hollow 112 is formed, greatly affects the devices over the substrate 100 greatly. This effect, known as the kink effect, is a process problem needs to be solved.

SUMMARY OF THE INVENTION

The invention provides a shallow trench isolation process. In this process, an oxide layer in a trench is formed, wherein the oxide layer fills the trench and has a sidewall above the trench. The process further comprises forming a polysilicon spacer on the sidewall and oxidizing the polysilicon spacer to transform it into an oxide spacer.

The polysilicon spacer can be formed by depositing a polysilicon layer over the oxide layer and the substrate, and then etching back the polysilicon layer to construct the polysilicon spacer. After the polysilicon spacer is formed on the sidewall of the oxide layer, a thin oxide layer is preferably formed by oxidizing surfaces of the substrate, the oxide layer, and the polysilicon spacer. The thin oxide layer is used as a sacrificial oxide layer in an ion-implantation step. After this implantation step, the thin oxide layer is removed. A thermal oxidation step is preferably performed to oxidize the polysilicon spacer and to grow a gate oxide layer over the substrate. A polysilicon layer and a tungsten silicon layer serving as a word line are sequentially formed over the gate oxide layer.

In one embodiment, the oxide layer and the trench of the substrate are fabricated as follows. A pad oxide layer and a mask pattern are sequentially formed over the substrate. The mask pattern is used as an etching mask for etching the pad oxide layer and the substrate, and thus the desired trench is formed in the substrate. A liner oxide layer is conformally grown along a surface of the trench. The oxide layer filling the trench has a surface level higher than that of the silicon nitride layer. The oxide layer over the silicon nitride layer is removed. The silicon nitride layer is removed over the substrate, thereby the oxide layer has an exposed sidewall.

The polysilicon spacer or the oxide spacer protects the sidewall of the oxide layer from being eroded in subsequent etching steps. Therefore, the oxide layer has a smooth sidewall without any hollow therein in this present invention, unlike the oxide layer formed in a conventional STI process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A–2J are schematic, cross-sectional views of a shallow trench isolation (STI) process according to one preferred embodiment of this invention.

Figure 1A:
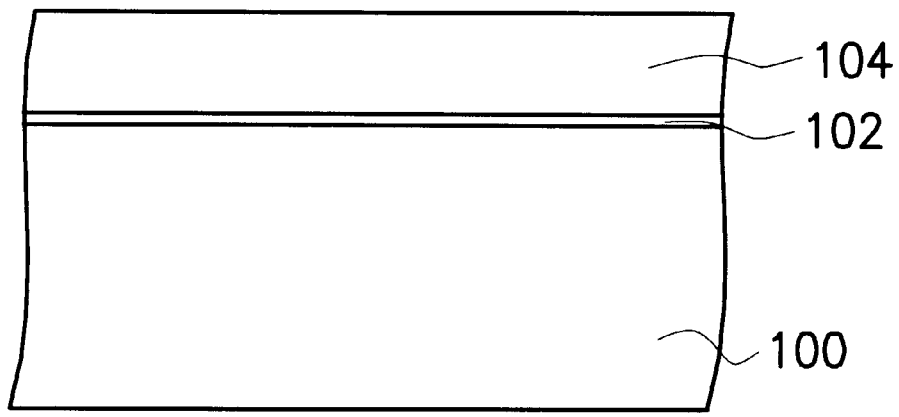
FIGS. 1A–1D are schematic, cross-sectional views of a conventional shallow trench isolation process.
Figure 1B:
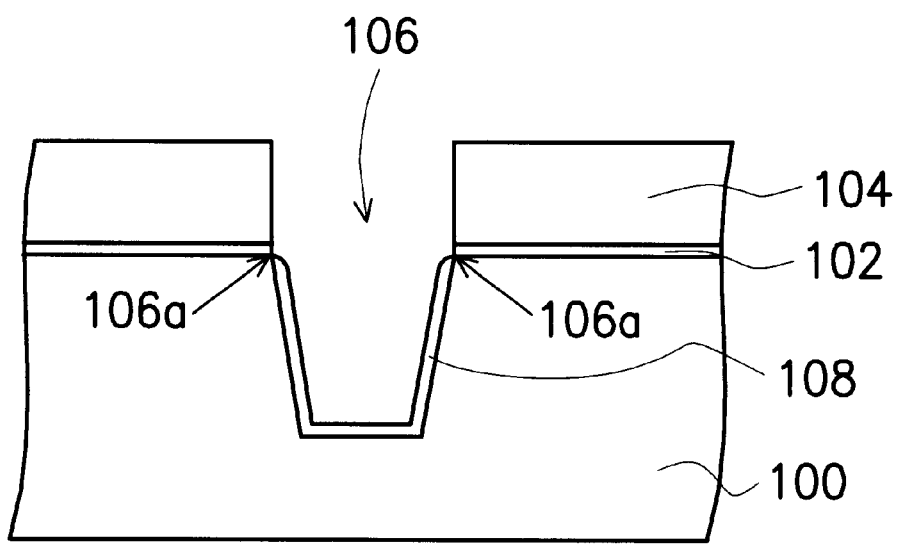
Figure 1C:
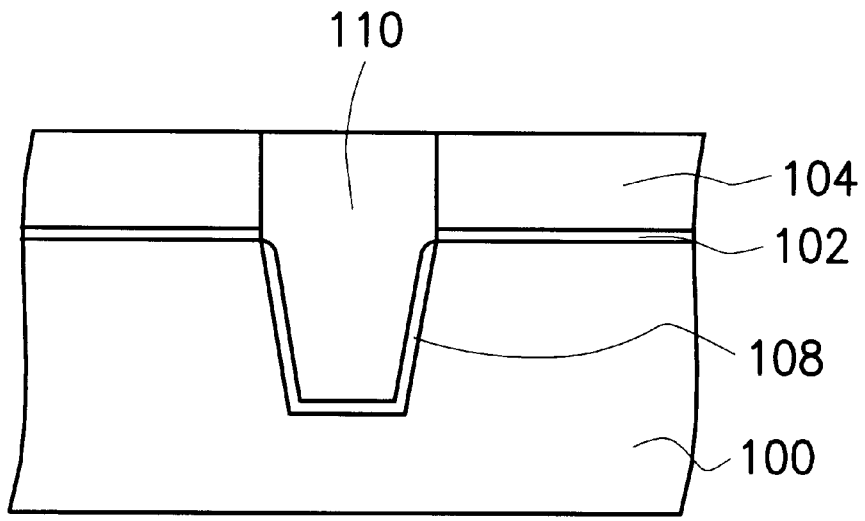
Figure 1D:
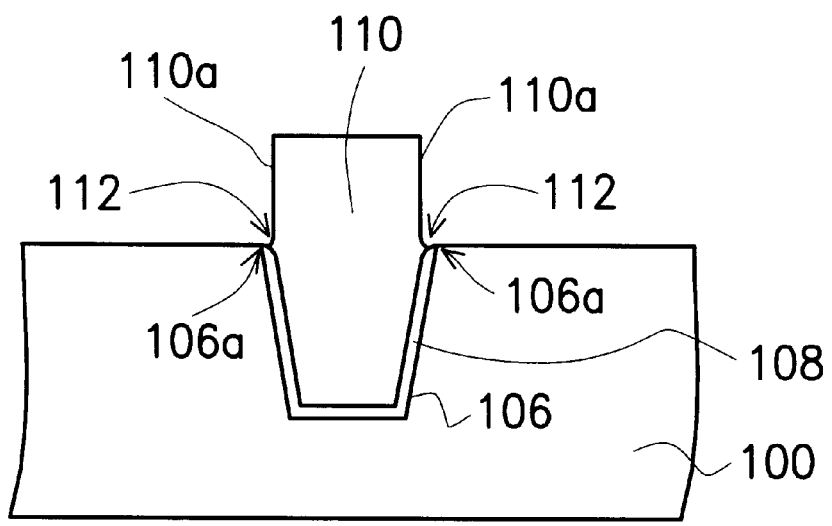
Figure 2A:
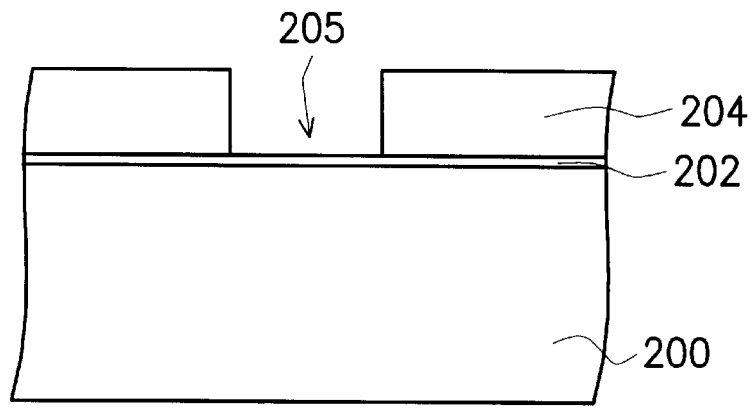
FIGS. 2A–2J are schematic, cross-sectional views of a shallow trench isolation process according to one preferred embodiment of this invention.

Referring to FIG. 2A, a pad oxide layer 202 is formed by thermal oxidation over a substrate (e.g. silicon substrate) 200. A mask layer 204, such as a silicon nitride layer with a thickness of about 800–1000 angstroms, is formed over the pad oxide layer 202. The mask layer 204 is patterned by a process comprising a photolithography step.

Figure 2B:
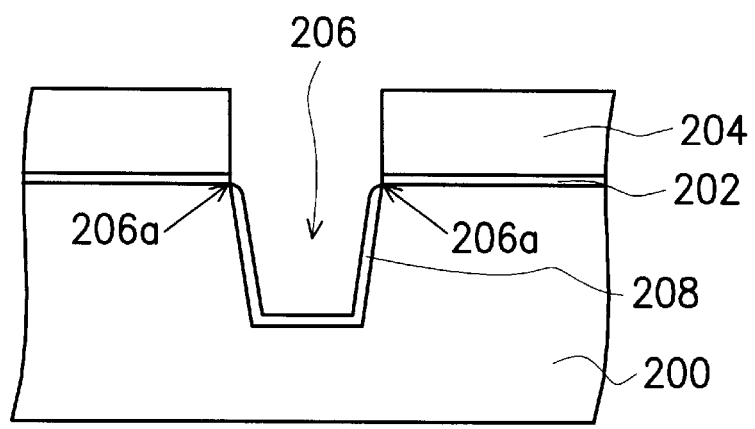

Referring to FIG. 2B, the pad oxide layer 202 and the substrate 200 are etched using the patterned mask 204 as an etching mask, and thus a trench 206 is formed in the substrate 200. A liner oxide layer 208 is conformally grown along a surface of the trench 206 by oxidation.

Figure 2C:
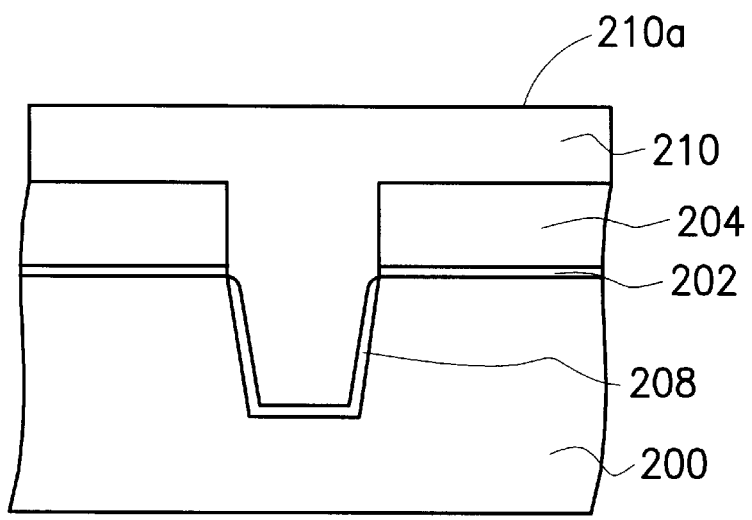

Referring to FIG. 2C, an oxide layer 210 is formed to fill the trench 206 (shown in FIG. 2B) in the substrate 200. The oxide layer 210 has a surface level 210a that is higher than that of the patterned mask 204. Preferably, the oxide layer 210 can be densified in ambient temperatures of about 1000° C. to about 1100° C. This densification can be carried out in an atmosphere of oxygen and nitrogen. This oxide layer 210 can be deposited by a reaction between tetraethosiloxane (TEOS) and ozone or by decomposing TEOS in plasma enhanced chemical vapor deposition (PECVD) or low pressure chemical vapor deposition (LPCVD) reactors.

Figure 2D:
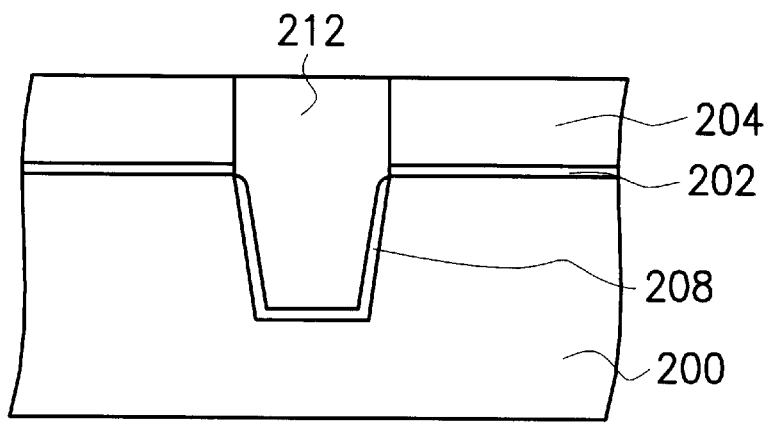

Referring to FIG. 2D, the oxide layer 212 is polished and the oxide layer 212 above the patterned mask 204 is removed. This polishing step can be performed by chemical-mechanical polishing.

Figure 2E:
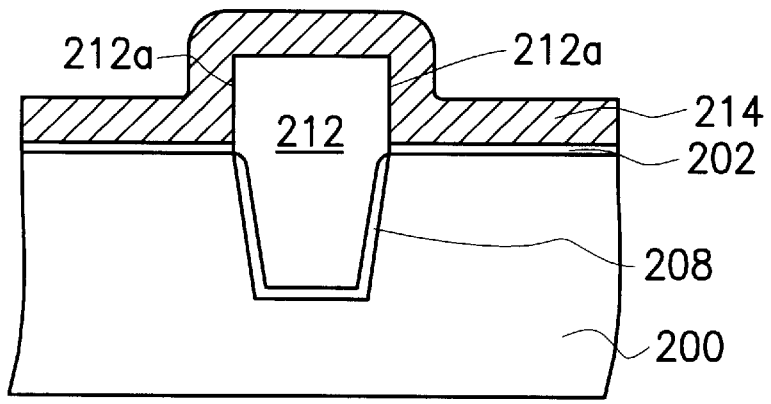

Referring to FIG. 2E, the patterned mask 204 (shown in FIG. 2D) over the substrate 200 is removed, thereby the oxide layer 212 has an exposed sidewall 212a. The oxide layer 212 and the exposed sidewall 212a thereof are covered with a polysilicon layer 214 formed over the substrate 200. The polysilicon layer 214, with a thickness of about 200 to about 300 angstroms, can be formed by a deposition method.

Figure 2F:
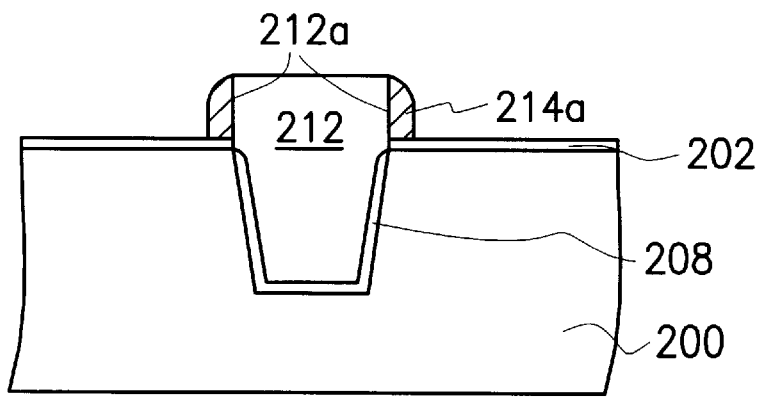

Referring to FIG. 2F, the polysilicon layer 214 (shown in FIG. 2E) is etched back until the pad oxide layer 202 is exposed, and thus a polysilicon spacer 214a is formed on the sidewall 212a of the oxide layer 212 above the substrate 200.

Figure 2G:
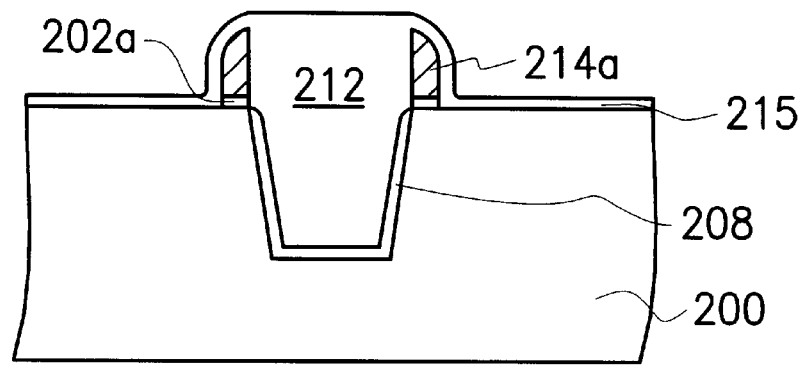

Referring to FIG. 2G, the pad oxide layer 202 (shown in FIG. 2F) that is exposed over the substrate 200 is removed, while pad oxide layer 202a remains under the polysilicon spacer 214a, and a thin oxide layer 215 is then grown by thermal oxidation. The thin oxide layer 215 is grown by oxidizing surfaces of the substrate 200, the oxide layer 212 and the polysilicon spacer 214a. After the thin oxide layer 215 is grown, a processing step such as an ion implantation step can be performed using the thin oxide layer 215 as a sacrificial oxide layer.

Figure 2H:
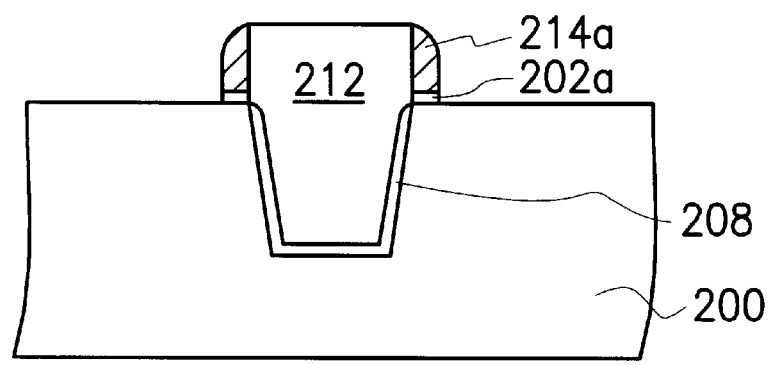

Referring to FIG. 2H, after the ion-implantation step is performed, the thin oxide layer 215 is almost removed except for the portion 202a under the polysilicon spacer 214a.

Figure 2I:
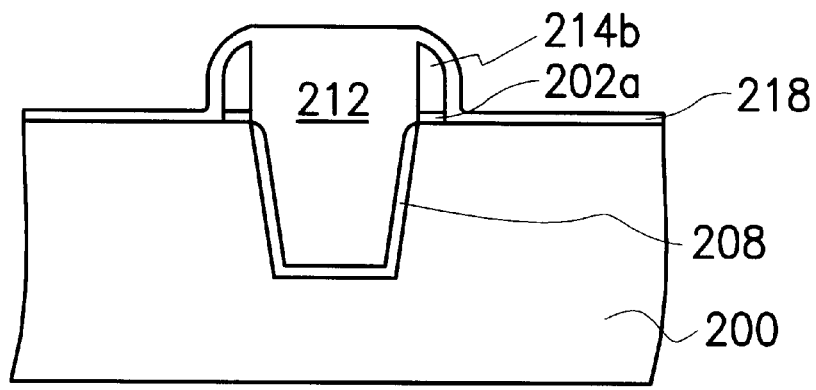

Referring to FIG. 2I, a gate oxide layer 218 is grown over the substrate 200 by performing a thermal oxidation step. In this thermal oxidation step, the polysilicon spacer 214a (shown in FIG. 2H) is oxidized and transformed into an oxide spacer 214b.

Figure 2J:
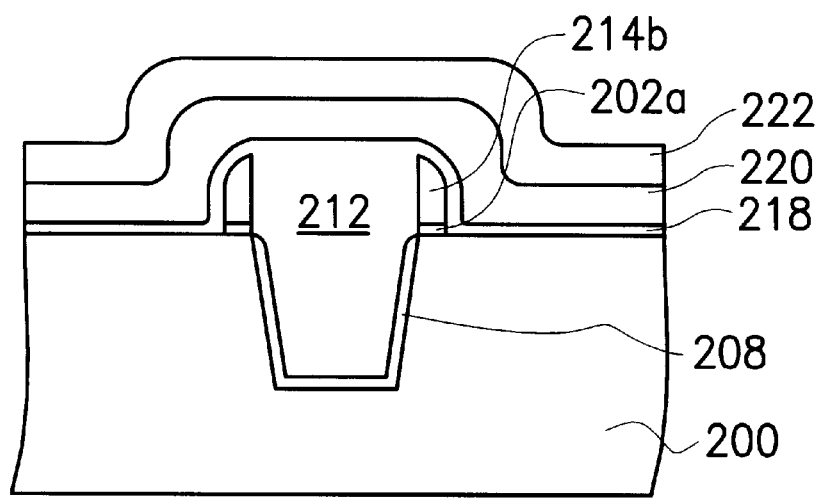

Referring to FIG. 2J, a polysilicon layer 220 and a tungsten silicon layer 222 serving as a word line are sequentially deposited over the gate oxide layer 218.

The previously described versions of the present invention have many advantages, comprising:
1. Either the polysilicon spacer or the oxide spacer protects the top corner of the trench from being directly in contact with the word line. Therefore, the top corner rarely affects devices formed over the gate oxide layer.
2. The polysilicon spacer or the oxide spacer protects the sidewall of the oxide layer from being eroded in those etching steps. Therefore, the oxide layer has a smooth sidewall without any hollow therein in this present invention, unlike the oxide layer formed in a conventional STI process. Since the polysilicon layer has no hollow for occupation, problems such as polysilicon shorts stemming from such hollows are solved in this invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A shallow trench isolation process, comprising:

providing a substrate having a trench formed therein;

filling the trench with an oxide layer, the oxide layer having a sidewall exposed elevated above the substrate;

forming a polysilicon spacer on the sidewall;

forming a sacrificial oxide layer on the polysilicon spacer and the substrate;

removing the sacrificial oxide layer; and oxidizing the polysilicon spacer to transform it into an oxide spacer.

2. The process of claim 1, wherein the polysilicon spacer is formed by a process comprising:

depositing a polysilicon layer over the oxide layer and the substrate; and etching back the polysilicon layer to complete the polysilicon spacer.

3. The process of claim 1, wherein the polysilicon layer has a thickness of about 200 to about 300 angstroms.

4. The process of claim 1, wherein the sacrificial oxide layer is grown from the substrate and the polysilicon spacer by thermal oxidation.

5. The process of claim 1, further comprising the steps of:

performing an ion-implantation step after the sacrificial oxide layer is formed.

6. The process of claim 1, wherein the polysilicon spacer is oxidized by performing a thermal oxidation step.

7. The process of claim 6, wherein a gate oxide layer is formed over the substrate in the thermal oxidation step.

8. The process of claim 7, further comprising the step of sequentially forming a polysilicon layer and a tungsten silicon layer over the gate oxide layer.

9. A shallow trench isolation process, comprising:

forming a pad oxide layer over a substrate;

forming a mask pattern over the pad oxide layer;

etching the pad oxide layer and the substrate using the mask pattern as an etching mask, so that a trench is formed in the substrate;

growing a liner oxide layer along a surface of the trench;

filling the trench in the substrate with an oxide layer, wherein the oxide layer has a surface level higher than that of the mask pattern;

removing a portion of the oxide layer, wherein the portion of the oxide layer is above the mask pattern;

removing the mask pattern above the substrate, thereby exposing a sidewall of the oxide layer;

forming a polysilicon spacer on the exposed sidewall of the oxide layer;

forming a sacrificial oxide layer on the polysilicon spacer;

removing the pad oxide layer and the sacrificial oxide layer; and oxidizing the polysilicon spacer.

10. The process of claim 9, wherein the polysilicon spacer is oxidized to transform it into an oxide spacer.

11. The process of claim 9, wherein the polysilicon spacer is formed by a process comprising:

depositing a polysilicon layer over the oxide layer and the substrate; and etching back the polysilicon layer until the pad oxide layer is exposed.

12. The process of claim 9, wherein the polysilicon layer has a thickness of about 200 to about 300 angstroms.

13. The process of claim 1, wherein the sacrificial oxide layer is grown by thermal oxidation.

14. The process of claim 9, further comprising the steps of:

performing an ion-implantation step after the sacrificial oxide layer formed.

15. The process of claim 9, wherein the polysilicon spacer is oxidized by performing a thermal oxidation step.

16. The process of claim 15, wherein a gate oxide layer is formed over the substrate in the thermal oxidation step.

17. The process of claim 16, further comprising the step of sequentially forming a polysilicon layer and a tungsten silicon layer over the gate oxide layer.

* * * * *